(12) United States Patent
Tian

(10) Patent No.: US 10,968,511 B2
(45) Date of Patent: Apr. 6, 2021

(54) SUBSTRATE BEARING ASSEMBLY AND MAGNETRON SPUTTERING DEVICE

(71) Applicant: BOE TECHNOLOGY GROUP CO., LTD., Beijing (CN)

(72) Inventor: Biao Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 501 days.

(21) Appl. No.: 15/824,442

(22) Filed: Nov. 28, 2017

(65) Prior Publication Data

US 2018/0312963 A1 Nov. 1, 2018

(30) Foreign Application Priority Data

Apr. 28, 2017 (CN) .......................... 201720470890.1

(51) Int. Cl.
*C23C 14/35* (2006.01)
*H01J 37/34* (2006.01)
*C23C 14/34* (2006.01)
*H01L 21/687* (2006.01)
*C23C 14/04* (2006.01)
*C23C 14/50* (2006.01)
*H01J 37/32* (2006.01)

(52) U.S. Cl.
CPC ............ *C23C 14/35* (2013.01); *C23C 14/042* (2013.01); *C23C 14/3407* (2013.01); *C23C 14/50* (2013.01); *H01J 37/32715* (2013.01); *H01J 37/34* (2013.01); *H01J 37/3435* (2013.01); *H01L 21/68764* (2013.01)

(58) Field of Classification Search
CPC .. B23Q 1/03; B23Q 1/25; H01L 21/67; H01L 21/28; H01L 21/682; H01L 21/683; H01L 21/6835; H01L 21/68764; H01L 2221/67; H01L 2221/683; H01L 2221/68363; B25J 11/0095; B25B 11/00; H01J 37/32715; H01J 37/34; H01J 37/3435
USPC .... 269/903, 289 R, 55, 58, 60, 71, 160, 181
See application file for complete search history.

(56) References Cited

U.S. PATENT DOCUMENTS

| | | | | |
|---|---|---|---|---|
| 6,102,057 A * | 8/2000 | Vogtmann | ............... | H01L 21/68 134/144 |
| 6,777,687 B2 * | 8/2004 | Vanderpot | ........... | H01J 37/3171 250/442.11 |
| 8,371,565 B2 * | 2/2013 | Tsai | .......... | B25B 5/06 204/298.15 |
| 8,939,275 B2 * | 1/2015 | Wang | .................. | B65G 13/075 198/394 |
| 9,583,309 B1 * | 2/2017 | Tye | .................. | H01L 21/26506 |
| 2014/0225321 A1 * | 8/2014 | Roh | ........ | C23C 14/50 269/37 |

(Continued)

*Primary Examiner* — Orlando E Aviles
*Assistant Examiner* — Robert F Neibaur
(74) *Attorney, Agent, or Firm* — Dinsmore & Shohl LLP

(57) ABSTRACT

The embodiments of the present disclosure provide a substrate bearing assembly and a magnetron sputtering apparatus. The substrate bearing assembly includes: a stage; and a bearing plate provided on the stage for carrying a substrate on which a film is to be formed. A side of the bearing plate is hinged with the stage by a hinge member, and the bearing plate is able to be rotated by the hinge member to be perpendicular to a plane in which the stage is located. The hinge member is able to translate on the stage in a direction perpendicular to a side of the bearing plate connecting with the hinge member.

18 Claims, 5 Drawing Sheets

(56) References Cited

U.S. PATENT DOCUMENTS

2015/0270147 A1\* 9/2015 Kobayashi ............ B25J 11/0095
　　　　　　　　　　　　　　　　　　　134/76
2018/0053673 A1\* 2/2018 Lee ..................... G03F 7/70833

\* cited by examiner

SUBSTRATE BEARING ASSEMBLY AND MAGNETRON SPUTTERING DEVICE

CROSS-REFERENCE TO RELATED APPLICATION

This application claims priority to and the benefit of Chinese Patent Application No. 201720470890.1, filed on Apr. 28, 2017, which is incorporated herein by reference and used for all purpose.

TECHNICAL FIELD

The present disclosure relates to a substrate bearing assembly and a magnetron sputtering device.

BACKGROUND

The Organic Light Emitting Diode (referred to as OLED for short) display device has been widely applied in various electronics including electronic products such as computer and cell phone, as it presents such advantages as self-luminous, thin and light, low power consumption, high contrast, high color gamut, feasibility in flexible display and so on.

In the conventional technology, the production of a film layer structure on a substrate may usually be accomplished in such manners as vacuum evaporation plating, physical vapor deposition film formation, or chemical vapor deposition film formation. Among them, magnetron sputtering film formation, as one of physical vapor deposition film formation manners, is more used in the production of a film layer of an OLED display device, due to its simple device structure, mature process and strong adhesive force of a formed film layer.

SUMMARY

An aspect of the embodiments of the present disclosure provides a substrate bearing assembly, which comprises: a stage; and a bearing plate provided on the stage for carrying a substrate on which a film is to be formed. A side of the bearing plate is hinged with the stage by a hinge member, and the bearing plate is able to be rotated by the hinge member to be perpendicular to a plane in which the stage is located. The hinge member is able to translate on the stage in a direction perpendicular to a side of the bearing plate connecting with the hinge member.

In some embodiments, the stage is provided with a translation rail extending in the direction perpendicular to a side of the bearing plate connecting with the hinge member, and the hinge member is disposed within the translation rail.

In some embodiments, the hinge member comprises a hinge shaft and a hinge sleeve mated with each other. The hinge shaft is disposed on the stage and the hinge sleeve is disposed on a side of the bearing plate, or the hinge shaft is disposed on a side of the bearing plate and the hinge sleeve is disposed on the stage.

In some embodiments, the substrate bearing assembly of the embodiments of the present disclosure further comprises: a rotation driver provided on the hinge member; and a linear driver provided at one end in a translation direction of the hinge member. The rotation driver drives the bearing plate to rotate with the hinge member, and the linear driver drives the hinge member to translate along a translation direction of the hinge member.

In some embodiments, a cushioning spacer is further disposed on a surface of the bearing plate on which the substrate is carried.

In some embodiments, when the bearing plate is rectangular, four cushioning spacers are provided, which are disposed on four corners of the bearing plate respectively.

In some embodiments, a pressure sensor is further disposed on a surface of the bearing plate on which the substrate is carried, and the pressure sensor is electrically connected to the rotation driver and the linear driver.

In some embodiments, when the bearing plate is rectangular and four cushioning spacers are provided on four corners of the bearing plate respectively, four pressure sensors are provided, which are disposed between the bearing plate and the cushioning spacers respectively.

In some embodiments, a clamping portion is further provided on an edge of the bearing plate, to fix a relative positional relationship between the bearing plate and the substrate to be carried on the bearing plate.

A further aspect of the embodiments of the present disclosure provides a magnetron sputtering device, which comprises the substrate bearing assembly according to any one of the substrate bearing assemblies described above. The magnetron sputtering device further comprises a mask holder for fixing a mask in a vertical direction. The hinge member is able to move to come into contact with the mask.

A still further aspect of the embodiments of the present disclosure provides a method for operating a magnetron sputtering device. The method comprises: translating and rotating a hinge member, such that a substrate disposed on a bearing plate is attached to a mask on a mask holder, wherein a film is to be formed on the substrate; wherein a rotation driver controlling rotation of the hinge member and a linear driver controlling translation of the hinge member are feedback controlled according to values detected by pressure sensors disposed at respective positions between the substrate and the bearing plate, so that respective positions on the substrate are attached to the mask.

BRIEF DESCRIPTION OF THE DRAWINGS

In order to more clearly explain the embodiments of the present disclosure or the technical solutions in the conventional technology, a brief introduction will be given below for the drawings required to be used in the description of the embodiments or the conventional technology. It is obvious that, the drawings illustrated as follows are merely some of the embodiments of the present disclosure. For a person skilled in the art, he or she may also acquire other drawings according to the disclosed drawings on the premise that no inventive effort is involved.

DETAILED DESCRIPTION

Next, the technical solution in the embodiments of the present disclosure will be explicitly and completely described in combination with the drawings in the embodiments of the present disclosure. Apparently, the described embodiments are merely part of the embodiments of the present disclosure, rather than all the embodiments. On the basis of the embodiments of the present disclosure, all the other embodiments acquired by a person skilled in the art on the premise that no inventive effort is involved fall into the protection scope of the present disclosure.

In a magnetron sputtering device, a film layer corresponding to a pattern on a mask is formed by sputtering on a substrate through the mask. First, a mask is fixed on a mask holder by an edge area of the mask in a vertical direction, and the substrate on which a film is to be formed is placed on a bearing plate of a stage. Then, a bearing plate carrying the substrate is uprightly flipped with one of its sides proximate to the mask as a center, such that the substrate approaches towards the mask. After the substrate approaches towards the mask, the magnetron sputtering device is evacuated and powered on, such that high-energy charged particles are formed inside the magnetron sputtering device under the effect of radio-frequency voltage. High-energy charged particles bombard a target surface. The bombarded target particles are deposited on a surface of the substrate through the mask to form a sputtered film layer under the effect of an electric field and a magnetic field.

In order to stably place the substrate on the bearing plate during a sputtering film formation process, and facilitate flipping the substrate back to a horizontal state so as to be removed out of the device after accomplishment of the sputtering film formation, since the bearing plate and the substrate cannot be fully erected to a vertical state, the substrate may inevitably leave a slit or gap with the mask fixed on the mask holder during the sputtering film formation process. Upon sputtering film formation, the slit or gap may penetrate into and accumulated with a film layer material, such that a shadow area is present on a film layer formed by sputtering on the substrate, and there is a deviation from a film layer pattern required to be formed on the mask, thereby affecting the display effect of a produced OLED device.

The embodiments of the present disclosure provide a substrate bearing assembly and a magnetron sputtering apparatus, which are capable of solving a problem that in the conventional magnetron sputtering device, the substrate to be film-formed is difficult to be in close contact with the mask, causing a great pattern deviation between a film layer formed on the substrate to be film-formed and a film layer required to be formed on the mask.

Figure 1A:
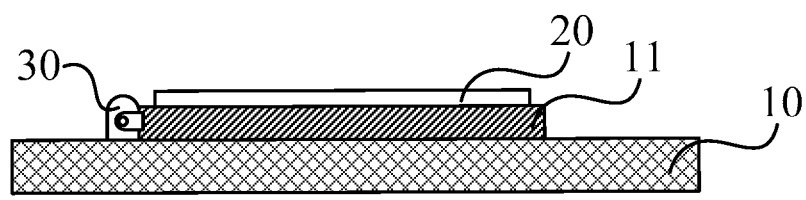
FIG. 1a is state of a schematic view of the structure of a substrate bearing assembly provided by the embodiments of the present disclosure.

The embodiments of the present disclosure provide a substrate bearing assembly, which as shown in FIG. 1a comprises: a stage 10; and a bearing plate 11 provided on the stage 10 for carrying a substrate 20 on which a film is to be formed (hereafter "substrate"). A side of the bearing plate 11 is hinged with the stage 10 by a hinge member 30, and the bearing plate 11 is rotatable by the hinge member 30 to be perpendicular to a plane in which the stage 10 is located. The hinge member 30 can translate on the stage 10 in a direction perpendicular to a side of the bearing plate 11 connecting with the hinge member 30.

The bearing plate 11 is disposed on the stage 10 by connection with the stage 10 through the hinge member 30. The hinge member 30 connects with a side of the bearing plate 11. When the bearing plate 11 is located at a horizontal position as shown in FIG. 1a, the substrate 20 is placed and fixed to an upper surface of the bearing plate 11. Then, in a direction shown by a dotted arrow in FIG. 1b, by means of rotation of the hinge member 30, the bearing plate 11 can drive the substrate 20 so that the bearing plate 11 and the substrate 20 can rotate upright together until a state that they are perpendicular to a plane where the stage 10 is located is reached.

Figure 1B:
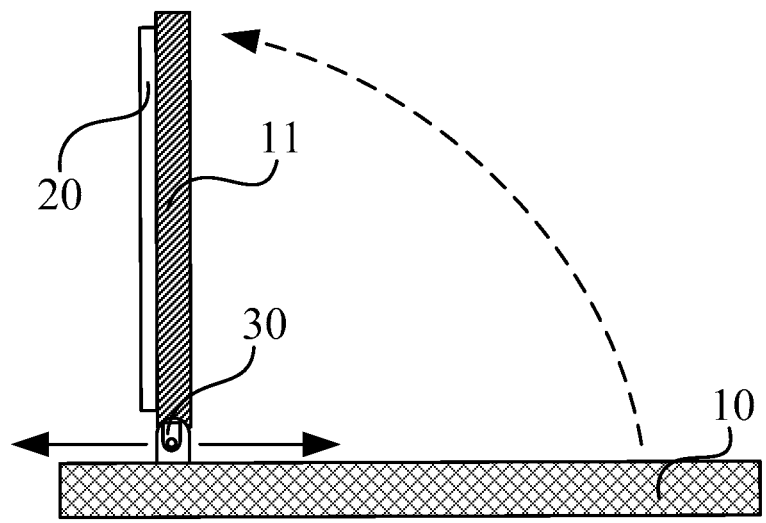
FIG. 1b is state of a schematic view of the structure of a substrate bearing assembly provided by the embodiments of the present disclosure.

In a case that the bearing plate 11 can rotate upright under rotational control of the hinge member 30, as shown by a solid arrow in FIG. 1b, the hinge member 30 is further movable linearly on the stage 10, and a translation direction of the hinge member 30 and a side of the bearing plate 11 connecting with the hinge member 30 are perpendicular to each other. In this way, the bearing plate 11 approaches towards a mask holder provided with a mask along with the translation of the hinge member 30 until the side of the bearing plate 11 connecting with the hinge member 30 is in contact with the mask holder. Then, the hinge member 30 is further rotated so that after the bearing plate 11 and the substrate 20 disposed on the bearing plate 11 are erected, they are integrally attached to the mask.

In order to enable the bearing plate 11 and the substrate 20 disposed on the bearing plate 11 to attach to the mask, the side of the bearing plate 11 connecting with the hinge member 30 refers to the side of the bearing plate 11 near to the mask.

In the substrate bearing assembly of the embodiments of the present disclosure, the structure of the stage 10 is not specifically defined. The shape and the size of the stage 10 may be correspondingly designed according to the space of the magnetron sputtering device where it is located as well as the shape and size of the substrate 20. In the embodiments of the present disclosure, the stage 10 only needs to satisfy the following conditions: the stage 10 includes at least a bearing plate 11 for carrying the substrate 20, and the bearing plate 11 can be horizontally and stably placed on the stage 10 and can rotate upright along a side of the bearing plate 11 connecting with the hinge member 30 under the drive of the hinge member 30.

The embodiments of the present disclosure provide a substrate bearing assembly, which comprises: a stage; and a bearing plate provided on the stage for carrying the substrate on which a film is to be formed. A side of the bearing plate is hinged with the stage by a hinge member, and the bearing plate can be rotated by the hinge member to be perpendicular to a plane in which the stage is located. The hinge member can translate on the stage in a direction perpendicular to a side of the bearing plate connecting with the hinge member. In a state of a side of the bearing plate being hinged with the stage by a hinge member, the side of the bearing plate may bring the substrate carried on the bearing plate to rotate to be perpendicular to a plane in which the stage is located. At the same time, the hinge member is also capable of bringing the bearing plate and the substrate carried on the bearing plate to translate along a direction perpendicular to a side of the bearing plate connecting with the hinge member, such that the substrate can be closely attached to the mask, a gap present between the substrate and the mask due to incomplete contact can be reduced, and an overlap degree between a pattern film-formed on the substrate by sputtering and a film layer pattern required to be formed on the mask can be improved, thereby improving the display effect of a produced OLED device by a sputtering film formation process.

Figure 2:
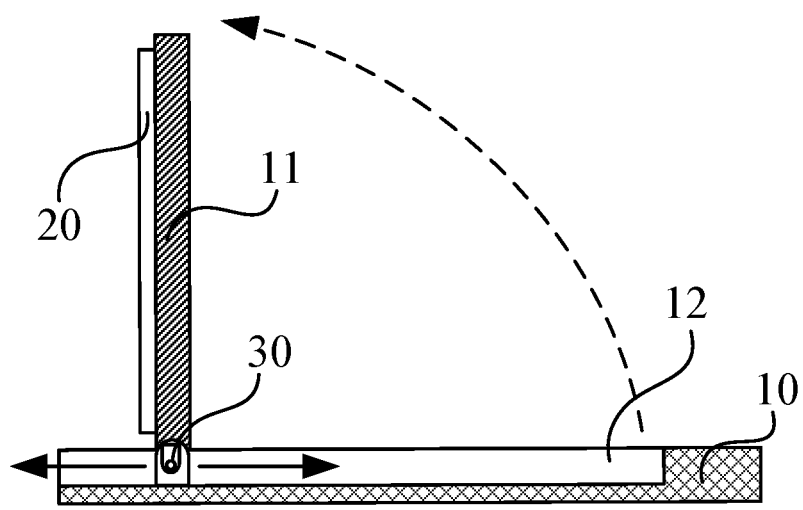
FIG. 2 is a schematic view of the structure of a stage in a substrate bearing assembly provided by the embodiments of the present disclosure, wherein the stage includes a translation rail.

In some embodiments, as shown in FIG. 2, the stage 10 is provided with a translation rail 12 extending in a direction which is perpendicular to a side of the bearing plate 11 connecting with the hinge member 30, and the hinge member 30 is disposed within the translation rail 12.

As shown in FIG. 2, the direction in which the translation rail 12 extends is also perpendicular to a side of the bearing plate 11 connecting with the hinge member 30, i.e. the direction in which the translation rail 12 extends is the same as the translation direction of the hinge member 30. In this way, the hinge member 30 is disposed within the translation rail 12 and can translate within the translation rail 12 along the direction in which the translation rail 12 extends, and thus a linear translation direction of the hinge member 30 is ensured, and a risk that the hinge member 30 is shaky or hard to be in close contact with the mask due to a shift of the hinge member 30 in a translation direction when the substrate is close to the mask is reduced.

Figure 3A:
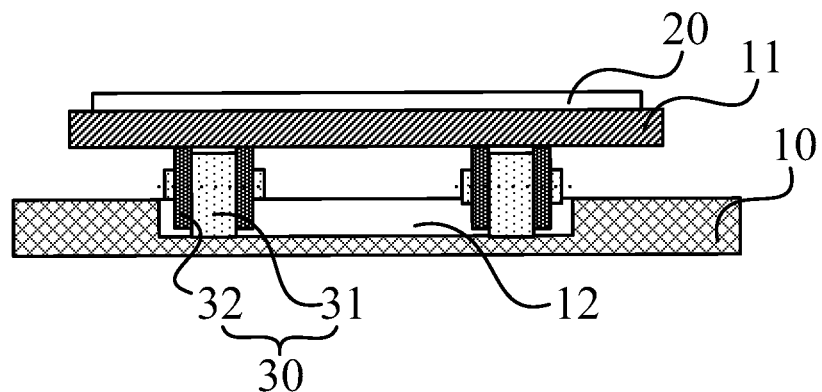
FIG. 3a is a configuration manner of a translation rail and hinge member with respect to a left view of FIG. 2.
Figure 3B:
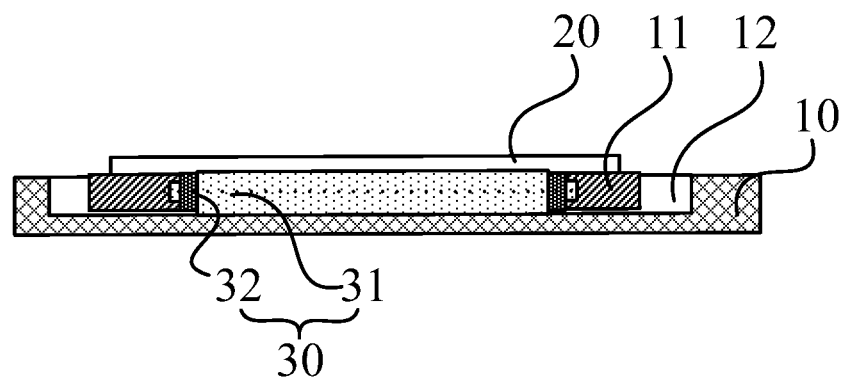
FIG. 3b is a configuration manner of another translation rail and hinge member with respect to a left view of FIG. 2.

The width of the translation rail 12 is not defined in the embodiments of the present disclosure. For example, as shown in FIG. 3a, the hinge member 30 may be disposed only within the translation rail 12, the bearing plate 11 with a side connected with the hinge member 30 is disposed on an upper surface of the stage 10, and when the hinge member 30 translates within the translation rail 12, the bearing plate 11 translates on the upper surface of the stage 10. In another example, as shown in FIG. 3b, the width of the translation rail 12 may be set to be greater than the width of the bearing plate 11, such that both the hinge member 30 and the bearing plate 11 with a side connected with the hinge member 30 are disposed within the translation rail 12. Under the circumstance that the bearing plate 11 does not rotate upright (a horizontally placed state as shown in FIG. 3b), when the hinge member 30 translates within the translation rail 12, the bearing plate 11 also translates within the translation rail 12.

In some embodiments, as shown in FIG. 3a, the hinge member 30 comprises a hinge shaft 31 and a hinge sleeve 32 mated with each other. As shown in FIG. 3a, the hinge shaft 31 is disposed on the stage 10 and the hinge sleeve 32 is disposed on a side of the bearing plate 11, or the hinge shaft 31 is disposed on a side of the bearing plate 11 and the hinge sleeve 32 is disposed on the stage 10.

The hinge member 30 may be constituted by a hinge shaft 31 and a hinge sleeve 32 mated with each other. For example, as shown in FIG. 3a, the hinge shaft 31 is disposed on the stage 10, the hinge sleeve 32 is fixedly disposed on a side of the bearing plate 11 and fixedly connected to the bearing plate 11, and the hinge sleeve 32 is sleeved on the hinge shaft 31 and can rotate about the hinge shaft 31, and thus bringing rotation of the bearing plate 11 connected with the hinge sleeve 32 and the substrate 20 fixed disposed on the bearing plate 11 to rotate to an erected state. Also, the hinge shaft 31 can translate within the translation rail 12 on the stage 10 along a direction in which the translation rail 12 extends, and thus bringing the hinge sleeve 32 as well as the bearing plate 11 and the substrate 20 to translate horizontally along a direction in which the translation rail 12 extends together to approach towards the mask. Alternatively, the hinge shaft 31 may be fixedly connected to a side of the bearing plate 11, and the hinge sleeve 32 has one end provided on the stage 10 and the other end sleeved on the hinge shaft 31 and rotatable about the hinge shaft 31. Likewise, there is a relative rotation between the hinge sleeve 32 and the hinge shaft 31, and thus being capable of bringing the bearing plate 11 connected with the hinge sleeve 32 and the substrate 20 fixed disposed on the bearing plate 11 to rotate to an erected state. At the same time, the hinge sleeve 32 is capable of bringing the bearing plate 11 and the substrate 20 to translate on the stage 10 along a translation direction of the bearing plate 11 together to approach towards the mask.

In the embodiments of the present disclosure, for the number of the hinge member 30 constituted by the hinge shaft 31 and the hinge sleeve 32 mated with each other is not specifically defined. As shown in FIG. 3a, there may be several hinge members provided along a side of the bearing plate 11 at intervals, and as shown in FIG. 3b, there is provided with only one hinge member with a large width, to integrally control a side of the bearing plate 11.

Figure 4:
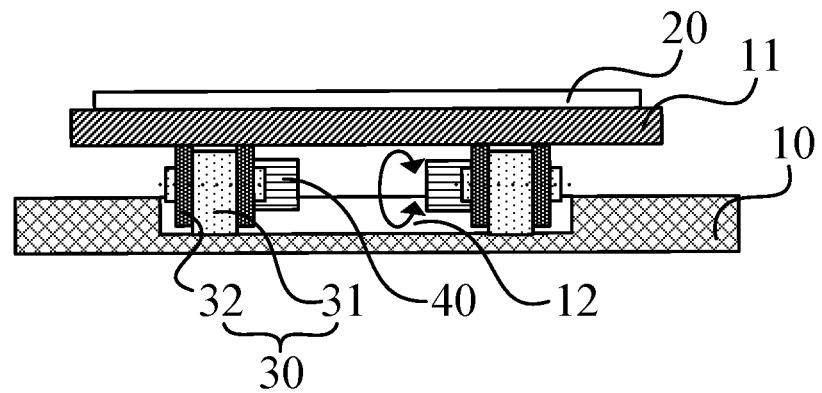
FIG. 4 is a schematic view of the structure of a substrate bearing assembly provided by the embodiments of the present disclosure, in which a rotation driver is included.
Figure 5:
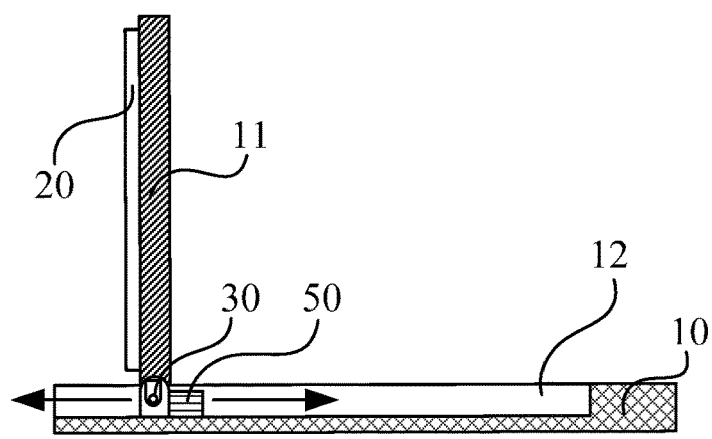
FIG. 5 is a schematic view of the structure of a substrate bearing assembly provided by the embodiments of the present disclosure, in which a linear driver is included.

In some embodiments, as shown in FIG. 4, the substrate bearing assembly of the embodiments of the present disclosure further comprises a rotation driver 40 provided on the hinge member 30. As shown in FIG. 5, the substrate bearing assembly further comprises a linear driver 50 provided on one end in a translation direction of the hinge member 30. The rotation driver 40 drives the bearing plate 11 to rotate under the effect of the hinge member 30, and the linear driver 50 drives the hinge member 30 to translate along a translation direction of the hinge member 30.

As shown in FIG. 4, the rotation driver 40 can drive the hinge member 30 to rotate, and thus bringing the bearing plate 11 connected with the hinge 30 to rotate. By controlling the rotation driver 40, it is not only possible to control rotation or stop of the hinge member 30, but also possible to accurately control a rotation speed and a rotation angle of the hinge member 30. For example, the rotation driver 40 may be a rotary motor, an output shaft of which is fixedly connected to the hinge sleeve 32 connected with the bearing plate 11. By controlling rotation of the output shaft of the rotary motor, it is possible to bring the hinge sleeve 32 to rotate in a corresponding direction and at a corresponding angle. By controlling a rotation speed of the output shaft of the rotary motor, it is also possible to control a rotation speed of the bearing plate 11.

As shown in FIG. 5, the linear driver 50 is connected to the hinge member 30, and the linear driver 50 is capable of driving the hinge member 30 to translate in its translation direction. By controlling a translation speed and distance of the linear driver 50, it is possible to define a translation speed and distance of the hinge member 30 as well as the bearing plate 11 driven by the hinge member 30. For example, the linear driver 50 may be a linear motor, a stator of which is fixedly connected to the hinge member 30. By controlling a rotation direction and distance of a rotor of the linear motor, it is possible to control a direction and distance of horizontal translation of the hinge member 30 caused by the stator.

In the substrate bearing assembly provided with the rotation driver 40 and/or the linear driver 50, a controller may be further provided (not shown in the drawings), which is connected to the rotation driver 40 and/or the linear driver 50 respectively. The rotation driver 40 and/or the linear driver 50 are controlled according to a preset program in the controller, such that during normal operation of the magnetron sputtering device in the embodiments of the present disclosure, the substrate bearing assembly is capable of working according to the preset program, and the automatic property of the substrate bearing assembly is improved. When the size of the substrate 20 in the magnetron sputtering device varies, it is only necessary to adjust set values in the controller. The preset corresponding values may be experience values obtained by a person skilled in the art according to experience and a feedback effect of a finished product in actual operation, and may also be design reference values or the like.

Figure 6:
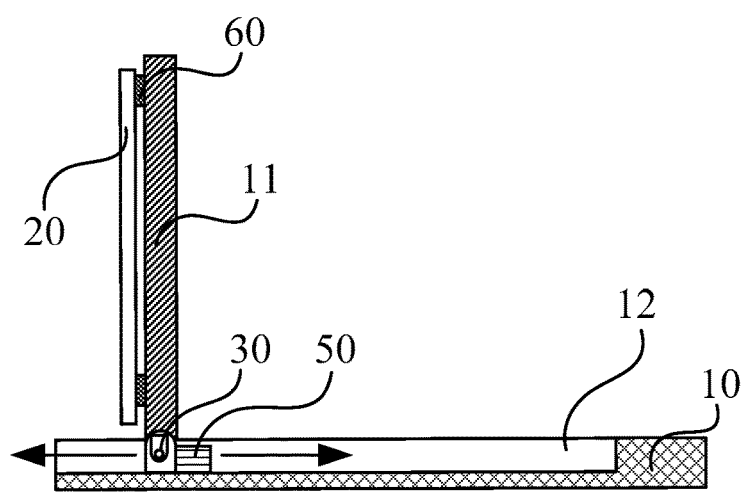
FIG. 6 is a schematic view of the structure of a substrate bearing assembly provided by the embodiments of the present disclosure, in which a cushioning spacer is included.

In some embodiments, as shown in FIG. 6, a cushioning spacer 60 is further disposed on a surface of the bearing plate 11 on which the substrate 20 is carried.

After the bearing plate 11 and the substrate 20 are attached to the mask by rotation and translation of the hinge member 30, if the rotation and the translation of the hinge member 30 are not stopped in time, it may cause the substrate 20 to further attach towards the mask under the pressure of the bearing plate 11, and it is possible to incur a local crack or breakage at a position of the substrate 20 subject to a greater pressure. For the magnetron sputtering device according to the embodiments of the present disclosure, once the operation of the magnetron sputtering process is started, the magnetron sputtering device is in a vacuum state inside. If there is a crack of the substrate 20, the magnetron sputtering device must be internally cleaned after it is recovered to a normal pressure state, and then the magnetron sputtering device is re-evacuated after a new substrate 20 is replaced, and thus severely affecting the operation efficiency of the magnetron sputtering device and consuming a lot of manpower and labor hours. Therefore, as shown in FIG. 6, a cushioning spacer 60 is provided between the substrate 20 and the bearing plate 11. In this way, when the substrate 20 is subject to a great pressure from the bearing plate 11, force cushioning can be obtained by means of the cushioning spacer 60, so that a risk that the substrate 20 is cracked or broken due to excessive local pressure is reduced.

Figure 7:
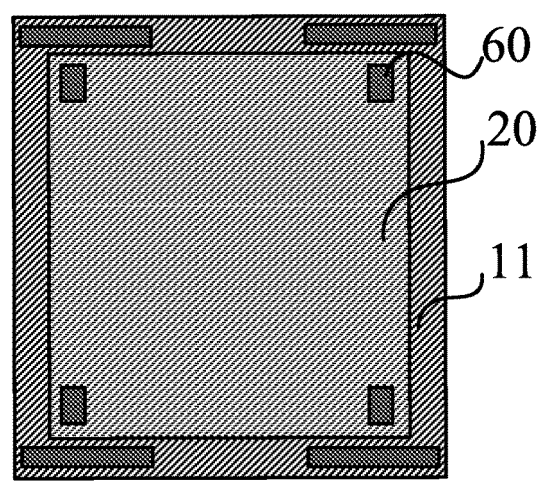
FIG. 7 is a left view of some areas included in the bearing plate in FIG. 6.

In some embodiments, as shown in FIG. 7, when the bearing plate 11 is rectangular, there are provided with four cushioning spacers 60, which are disposed at four corners of the bearing plate 11 respectively.

Positions on the substrate 20 that are usually most vulnerable to a crack due to an excessive pressure are edges or corners. As shown in FIG. 7, when the bearing plate 11 is rectangular, such positions are four corners of the bearing plate 11, i.e., corners of an area in which the bearing plate carries the substrate 20. Four cushioning spacers 60 are provided at the four corners respectively. In this way, it is possible to effectively protect edges and corners of the substrate 20, and reduce a risk that the substrate 20 is broken in the process of being attached to the mask due to an excessive pressure on the edges.

The material and shape of the cushioning spacer 60 is not specifically defined in the embodiments of the present disclosure, as long as it is possible to produce a cushioning effect over a force received at a set position.

Figure 10:
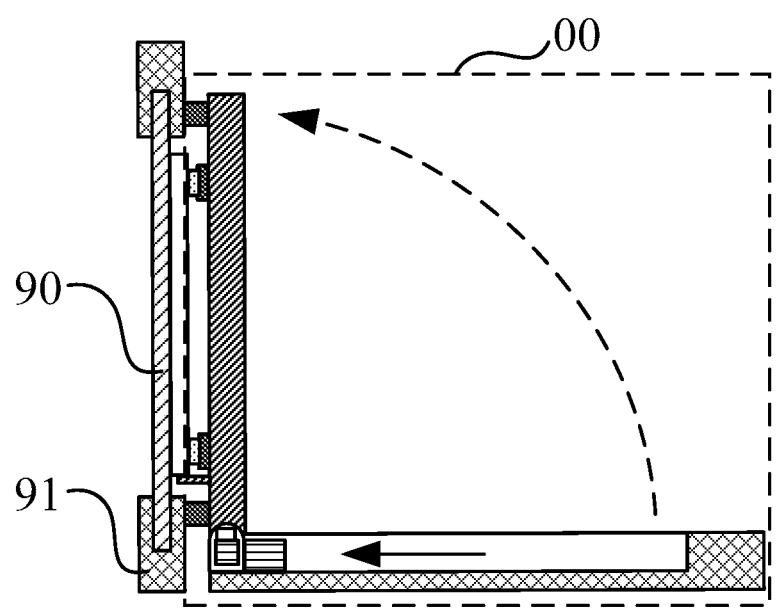
FIG. 10 is a schematic view of the structure of a magnetron sputtering device provided by the embodiments of the present disclosure.

As shown in FIG. 7, in the embodiments of the present disclosure, in addition that four cushioning spacers 60 are provided on the bearing plate 11 at positions corresponding to the four corners of the substrate 20, other cushioning spacers are provided on an edge portion where the bearing plate 11 is beyond from the substrate 20. As shown in FIG. 10, when the bearing plate 11 and the substrate 20 disposed on the bearing plate 11 are attached to the mask 90, the mask holder 91 which fixes the mask 90 also comes into contact with the edges of the bearing plate 11. Since both of the mask holder 91 and the bearing plate 11 are hard materials, by providing the cushioning spacers, it is possible to reduce a risk that collision and damage occur between the mask holder 91 and the bearing plate 11 due to excessive pressure during a process of the mask holder 91 and the bearing plate 11 coming into contact with each other, and also, it is possible to produce a cushioning effect over contact between the substrate 20 and the mask 90 at a certain extent. The shape of the cushioning spacers provided at an edge portion of the bearing plate 11 is not specifically defined in the embodiments of the present disclosure. It may be in a strip shape as shown in FIG. 7, and may also be in a spot shape in a case that there are several cushioning spacers provided at intervals, or a person skilled in the art may take a specific design on the shape of the cushioning spacers so as to cooperate with actual requirements according to specific conditions in actual operation.

Figure 8:
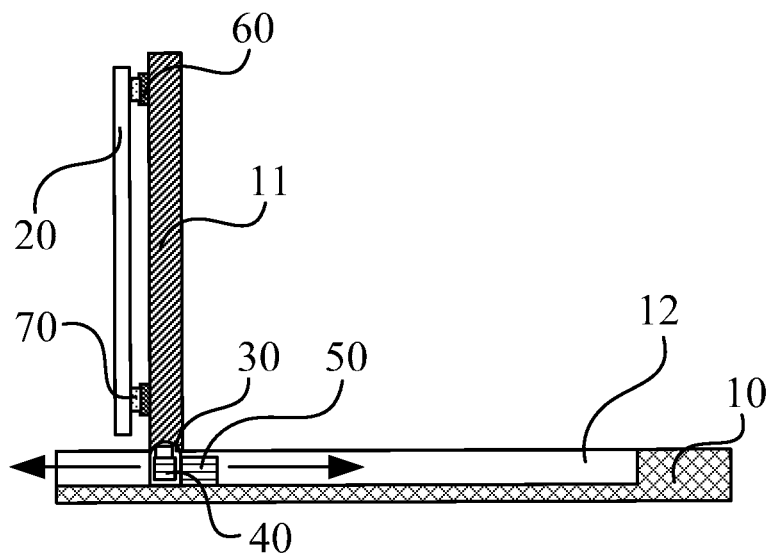
FIG. 8 is a schematic view of the structure of a substrate bearing assembly provided by the embodiments of the present disclosure, in which a pressure sensor is further included.

In some embodiments, as shown in FIG. 8, a pressure sensor 70 is further provided on a surface of the bearing plate 11 on which the substrate 20 is carried. The pressure sensor 70 is electrically connected to the rotation driver 40 and the linear driver 50.

As shown in FIG. 8, a pressure sensor 70 is provided between the bearing plate 11 and the substrate 20, and electrically connected to the rotation driver 40 and the linear driver 50 (in order not to affect the clarity of the view, a connection wire is not shown in FIG. 8). In this way, a pressure value between the bearing plate 11 and the substrate 20 detected by the pressure sensor 70 can be transmitted to the rotation driver 40 and the linear driver 50, and driving forces of the rotation driver 40 and the linear driver 50 are feedback controlled. For example, when the substrate bearing assembly of the embodiments of the present disclosure further comprises a controller, the pressure value detected by the pressure sensor 70 is transmitted to the controller in real time, and is compared with a preset standard value in the controller. When the pressure value is less than the preset standard value, it indicates that the substrate at the corresponding position has not been completely attached to the mask, and the controller controls the rotation driver 40 and the linear driver 50 to further provide rotation or translation forces. When the pressure value reaches a preset standard value, it indicates that the substrate at the corresponding position has been fully attached to the mask, and the controller controls the rotation driver 40 and the linear driver 50 to stop rotation or translation. Or, if the pressure value exceeds the preset standard value, it is possible to control the rotation driver 40 and the linear driver 50 to revolve to lessen a pressure subjected by the substrate 20, so that a risk of an extrusion crack of the substrate 20 due to an excessive pressure is reduced.

Figure 9:
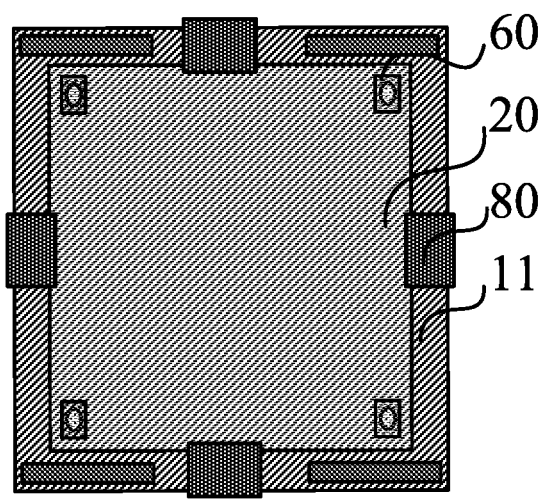
FIG. 9 is a left view of some areas included in the bearing plate in FIG. 8.

In some embodiments, as shown in FIG. 9, when the bearing plate 11 is rectangular, and four cushioning spacers 60 are provided at four corners of the bearing plate 11 respectively, there are provided with four pressure sensors 70, which are disposed between the bearing plate 11 and the cushioning spacers 60 respectively.

In this way, on one hand, since the pressure sensors 70 are disposed at four corners of the bearing plate 11, the pressure sensors 70 can perform real-time pressure monitoring at the four corners of the substrate 20 carried by the bearing plate 11, respectively, so that both the translation position and rotation angle of the substrate 20 can be feedbacked and controlled. On the other hand, since the pressure sensors 70 are disposed between the bearing plate 11 and the cushioning spacer 60, an extrusion force of the pressure sensors 70 over the substrate 20 can be cushioned by means of the cushioning spacers 60, so that a risk of an extrusion crack of the substrate 20 due to an excessive local pressure is reduced.

In some embodiments, as shown in FIG. 9, a clamping portion 80 is further provided on an edge of the bearing plate 11, to fix a relative positional relationship between the bearing plate 11 and the substrate 20 carried on the bearing plate 11.

In this way, in the process from the substrate 20 rotating upright to the substrate 20 translating to attach to the mask, due to a clamping effect of the clamping portion 80, it is possible to reduce a risk of relative sliding occurring between the substrate 20 and the bearing plate 11, and thus the positioning accuracy between the substrate 20 and the mask is improved before magnetron sputtering film formation is performed on the substrate 20 through the mask in the embodiments of the present disclosure.

In addition, as shown in FIG. 10, in the substrate bearing assembly of the embodiments of the present disclosure, there may further comprise a support boss fixedly connected with the bearing plate 11 on its side proximate to the hinge member 30. When the bearing plate 11 as well as the substrate 20 disposed on the bearing plate 11 are upright along with rotation of the hinge member 30 to attach to the mask, the support boss is located at a lower edge of the substrate 20, to bear a gravitational effect of the substrate 20 and stably support the substrate 20 after the substrate 20 is upright, so that the stability of the clamping portion 80 in clamping the substrate 20 is improved. For example, as shown in FIG. 10, when a support boss is provided on the bearing plate 11, the support boss may replace the clamping portion 80 provided on an edge of the bearing plate 11 connected to the hinge member 30.

A further aspect of the embodiments of the present disclosure provides a magnetron sputtering device. As shown in FIG. 10, the magnetron sputtering device comprises the substrate bearing assembly 00 according to any one of the aforementioned, and further comprises a mask holder 91 for fixing a mask 90 in a vertical direction. The hinge member 30 can move to come into contact with the mask 90.

As shown in FIG. 10, before the operation of the magnetron sputtering process is performed, the magnetron sputtering device of the embodiments of the present disclosure first translates and rotates the hinge member 30, such that the substrate 20 disposed on the bearing plate 11 is attached to the mask 90 on the mask holder 91. For example, first of all, by means of translation of the hinge member 30 in the substrate bearing assembly 00, the lower edge of the substrate 20 connecting with the hinge member 30 is in contact with a corresponding position of the mask 90. When the pressure value detected by the pressure sensor 70 disposed correspondingly to the lower edge of the substrate 20 reaches a preset value, the translation of the hinge member 30 stops. Also, the hinge member 30 brings the bearing plate 11 as well as the substrate 20 disposed on the bearing plate 11 to rotate, so that the substrate 20 rotates to an erected position and is completely attached to a surface of the mask 90. In this process, the rotation driver 40 controlling rotation of the hinge member 30 as well as the linear driver 50 controlling translation of the hinge member 30 are feedback controlled according to values detected in real time by the pressure sensors 70 disposed at respective positions between the substrate 20 and the bearing plate 11, so that respective positions on the substrate 20 can favorably attached to the mask 90. After the attachment is completed, the magnetron sputtering device is started to perform an operation of the magnetron sputtering process on the substrate 20. Due to a high degree of attachment between the substrate 20 and the mask 90, it is possible to allow a high accuracy of a pattern of a magnetron sputtering film layer formed on the substrate 20 by means of the mask 90, and further improve the product quality.

The foregoing descriptions are merely the embodiments of the present disclosure, and the protection scope of the present disclosure is not limited thereto. Anyone skilled in the art may easily anticipate a variation or a replacement within the technical scope disclosed by the present disclosure, which should all be within the protection scope of the present disclosure. Thus, the protection scope of the present disclosure should be determined by the appended claims.

What is claimed is:

1. A substrate bearing assembly, comprising:
   a stage;
   a bearing plate provided on the stage for carrying a substrate on which a film is to be formed, a side of the bearing plate being hinged with the stage by a binge member, and the hearing plate being able to be rotated by the hinge member to be perpendicular to a plane in which the stage is located, wherein the hinge member is able to translate on the stage in a direction perpendicular to a side of the bearing plate connecting with the hinge member;
   at least one cushioning spacer disposed on a surface of the bearing plate on which the substrate is carried; and
   at least one pressure sensor disposed between the at least one cushioning spacer and the surface of the bearing plate on which the substrate is carried.

2. The substrate bearing assembly according to claim 1, wherein the stage is provided with a translation rail extending in the direction perpendicular to the side of the bearing plate connecting with the hinge member, and the hinge member is disposed within the translation rail.

3. The substrate bearing assembly according to claim 1, wherein the hinge member comprises a hinge shaft and a hinge sleeve mated with each other, and
   wherein the hinge shaft is disposed on the stage and the hinge sleeve is disposed on a side of the bearing plate, or the hinge shaft is disposed on a side of the bearing plate and the hinge sleeve is disposed on the stage.

4. The substrate bearing assembly according to claim 1, further comprising:
   a rotation driver provided on the hinge member; and
   a linear driver provided at one end in a translation direction of the hinge member,
   wherein the rotation driver drives the bearing plate to rotate with the hinge member, and the linear driver drives the hinge member to translate along a translation direction of the hinge member.

5. The substrate hearing assembly according to claim 1, wherein when the bearing plate is rectangular, the at least one cushioning space comprises four cushioning spacers, which are disposed on four corners of the bearing plate respectively.

6. The substrate bearing assembly according to claim 4, wherein the pressure sensor is electrically connected to the rotation driver and the linear driver.

7. The substrate bearing assembly according to claim 6, wherein when the hearing plate is rectangular and the at least one cushioning spacer comprises four cushioning spacers provided on four corners of the bearing plate respectively, the at least one pressure sensor comprises four pressure sensors, which are disposed between the hearing plate and the cushioning spacers respectively.

8. The substrate bearing assembly according to claim 1, wherein a clamping portion is provided on an edge of the bearing plate, to fix a relative positional relationship between the bearing plate and the substrate carried on the bearing plate.

9. A magnetron sputtering device, comprising:
the substrate bearing assembly according to claim 1; and
a mask holder for fixing a mask in a vertical direction, wherein the hinge member is able to move to come into contact with the mask.

10. The magnetron sputtering device according to claim 9, wherein the stage is provided with a translation rail extending in the direction perpendicular to the side of the bearing plate connecting with the hinge member, and the hinge member is disposed within the translation rail.

11. The magnetron sputtering device according to claim 9, wherein the hinge member comprises a hinge shaft and a hinge sleeve mated with each other, and
wherein the hinge shaft is disposed on the stage and the hinge sleeve is disposed on a side of the bearing plate, or the hinge shaft is disposed on a side of the bearing plate and the hinge sleeve is disposed on the stage.

12. The magnetron sputtering device according to claim 9, wherein the substrate bearing assembly further comprises:
a rotation driver provided on the hinge member; and
a linear driver provided at one end in a translation direction of the hinge member,
wherein the rotation driver drives the bearing plate to rotate with the hinge member, and the linear driver drives the hinge member to translate along a translation direction of the hinge member.

13. The magnetron sputtering device according to claim 12, wherein when the bearing plate is rectangular, the at least one cushioning space comprises four cushioning spacers, which are disposed on four corners of the bearing plate respectively.

14. The magnetron sputtering device according to claim 12, wherein the at least one pressure sensor is electrically connected to the rotation driver and the linear driver.

15. The magnetron sputtering device according to claim 14, wherein when the bearing plate is rectangular and the at least one cushioning spacer comprises four cushioning spacers provided on four corners of the bearing plate respectively, the at least one pressure sensor comprises four pressure sensors, which are disposed between the bearing plate and the cushioning spacers respectively.

16. The magnetron sputtering device according to claim 9, wherein a clamping portion is provided on an edge of the bearing plate, to fix a relative positional relationship between the bearing plate and the substrate carried on the bearing plate.

17. A method for operating a magnetron sputtering device, comprising: using the substrate bearing assembly according to claim 1; translating and rotating the hinge member, such that a substrate disposed on the bearing plate is attached to a mask on a mask holder, wherein a film is to be formed on the substrate; wherein a rotation driver controlling rotation of the hinge member and a linear driver controlling translation of the hinge member are feedback controlled according to values detected by the at least one pressure sensor disposed at a respective position between the substrate and the bearing plate, so that the said respective position on the substrate is attached to the mask.

18. The method according to claim 17, wherein translating and rotating the hinge member, such that the substrate disposed on the bearing plate is attached to the mask on the mask holder comprises: by translating the hinge member in the substrate bearing assembly, causing a lower edge of the substrate connecting with the hinge member to be in contact with a corresponding position of the mask, and when the pressure value detected by the at least one pressure sensor disposed correspondingly to the lower edge of the substrate reaches a preset value, stopping the translation of the hinge member; bringing, by the hinge member, the bearing plate and the substrate disposed on the bearing plate to rotate, so that the substrate rotates to an erected position and is attached to a surface of the mask.

* * * * *